(12) United States Patent (10) Patent No.: US 12,678,919 B2
Ooyachi et al. (45) Date of Patent: Jul. 14, 2026

(54) SUBSTRATE HOLDING MEMBER

(71) Applicant: Niterra Co., Ltd., Nagoya (JP)

(72) Inventors: Kazuaki Ooyachi, Nagoya (JP);
Hiroyuki Nakamura, Nagoya (JP)

(73) Assignee: NITERRA CO., LTD., Nagoya (JP)

( * ) Notice: Subject to any disclaimer, the term of this
patent is extended or adjusted under 35
U.S.C. 154(b) by 394 days.

(21) Appl. No.: 18/497,553

(22) Filed: Oct. 30, 2023

(65) Prior Publication Data

US 2024/0139913 A1      May 2, 2024

(30) Foreign Application Priority Data

Oct. 31, 2022     (JP) ................................. 2022-174694
Jun. 30, 2023     (JP) ................................. 2023-107808

(51) Int. Cl.
B25B 11/00          (2006.01)
H10P 72/76          (2026.01)
H10P 72/78          (2026.01)

(52) U.S. Cl.
CPC ........ B25B 11/005 (2013.01); H10P 72/7614
(2026.01); H10P 72/78 (2026.01)

(58) Field of Classification Search
CPC ............. B25B 11/005; H01L 21/68735; H01L
21/6838; H01L 21/683; H01L 21/6875;
H10P 72/7614; H10P 72/78
See application file for complete search history.

(56) References Cited

U.S. PATENT DOCUMENTS

| | | | | |
|---|---|---|---|---|
| 10,468,289 | B2 * | 11/2019 | Ishino ................. | H01L 21/6875 |
| 10,755,959 | B2 * | 8/2020 | Iwabuchi ........... | H01L 21/6875 |
| 11,049,758 | B2 * | 6/2021 | Ushimaru .......... | H01L 21/6838 |
| 2002/0036373 | A1 * | 3/2002 | Kosakai ............... | B25B 11/005 |
| | | | | 269/21 |
| 2003/0001103 | A1 * | 1/2003 | Kobayashi ......... | H01L 21/6835 |
| | | | | 269/21 |
| 2003/0090070 | A1 * | 5/2003 | Endou .................... | B23Q 3/154 |
| | | | | 279/128 |
| 2009/0060688 | A1 * | 3/2009 | Asada .................... | B23Q 3/088 |
| | | | | 414/217 |

(Continued)

FOREIGN PATENT DOCUMENTS

| | | |
|---|---|---|
| JP | H10-242255 A | 9/1998 |
| JP | 2011-114238 A | 6/2011 |

*Primary Examiner* — Seahee Hong

(74) *Attorney, Agent, or Firm* — Stites & Harbison,
PLLC; Jeffrey A. Haeberlin

(57)          ABSTRACT

A substrate holding member includes: a base body including
an outer peripheral region and an upper surface including an
outer periphery, a vent hole close to the outer periphery, a
concentric imaginary circle passing through the vent hole,
the outer peripheral region on an outer side of the imaginary
circle; and a plurality of pin-shaped convex portions pro-
truding upward from the base body; wherein at least a part
of the pin-shaped convex portions arranged in the outer
peripheral region are first pin-shaped convex portions that
each include a first convex element and a second convex
element, the first convex element protruding upward from
the base body, and the second convex element protruding
upward from an upper end surface of the first convex
element and having an upper end surface whose area is
smaller than an area of the upper end surface of the first
convex element.

6 Claims, 12 Drawing Sheets

(56) References Cited

U.S. PATENT DOCUMENTS

2015/0311108 A1* 10/2015 Horiuchi ............ H01L 21/6875
                                                    269/302
2018/0374739 A1* 12/2018 Onodera ................ H10P 72/78

* cited by examiner

WIDTH OF GROOVED PORTION

40

WIDTH OF GROOVED
PORTION

44

16

ROW  ROW

40

WIDTH OF GROOVED
PORTION

44

16

ROW  ROW

FIG. 13

| | ARRANGEMENT OF FIRST PIN-SHAPED CONVEX PORTIONS | RATIO OF HEIGHT OF SECOND CONVEX ELEMENTS | SUBSTRATE HAVING 0.4-mm CURVE | | SUBSTRATE HAVING 0.8-mm CURVE | |
|---|---|---|---|---|---|---|
| | | | EVALUATION OF ATTRACTION | FLATNESS | EVALUATION OF ATTRACTION | FLATNESS |
| EXAMPLE 1 | OUTER PERIPHERAL REGION | 0.5 | GOOD | EXCELLENT | GOOD | EXCELLENT |
| EXAMPLE 2 | CIRCULAR-RING-SHAPED REGION | 0.5 | GOOD | EXCELLENT | GOOD | GOOD |
| EXAMPLE 3 | ALL REGIONS | 0.5 | GOOD | GOOD | GOOD | GOOD |
| EXAMPLE 4 | OUTER PERIPHERAL REGION | 0.33 | GOOD | GOOD | POOR | – |
| EXAMPLE 5 | OUTER PERIPHERAL REGION | 0.67 | GOOD | GOOD | GOOD | GOOD |
| COMPARATIVE EXAMPLE 1 | NO FIRST PIN-SHAPED CONVEX PORTIONS | – | GOOD | POOR | POOR | – |

SUBSTRATE HOLDING MEMBER

BACKGROUND OF THE INVENTION

I. Field of the Invention

The present invention relates to a substrate holding member that attracts and holds a substrate.

2. Description of the Related Art

Hitherto, a substrate holding member that holds by vacuum attraction a substrate, such as a silicon wafer, in a manufacturing process of a semiconductor or the like, particularly, for example, in an exposure step, a testing step, and a dicing step, has been used. Such a substrate holding member uses a method of holding a substrate by vacuum discharging a space in a rear surface of the substrate and a space in a front surface of a base body.

Patent Literature 1 discloses a vacuum attracting device that, in order to maintain high flatness accuracy, forms a plurality of tapering projections on a front surface of a base body and decreases a contact area between front surfaces of the projections and a substrate to thereby minimize production of particles and occurrence of contamination between a rear surface of the substrate and the front surface of the base body.

Patent Literature 2 discloses a substrate holding device that, in order to straighten a curved substrate, divides a region including a plurality of pin-shaped convex portions into a central region and an outer peripheral region and sets the depth of the central region to be larger than the depth of the outer peripheral region to thereby decrease the air resistance of vacuum discharge at the central region and increase the attraction force at an outer peripheral portion, as a result of which a curved substrate is attracted.

CITATION LIST

Patent Literature

PTL 1: Japanese Unexamined Patent Application Publication No. H10-242255
PTL 2: Japanese Unexamined Patent Application Publication No. 2011-114238

A substrate to be attracted is not necessarily flat, and may have a deformed shape, such as a bent shape or curved shape, and thus even such a substrate needs to be attracted in the same way that a flat substrate is attracted. In recent years, requirement standards with respect to the flatness of a substrate have been raised and demands for attracting with good flatness a substrate that is relatively largely curved have been made. Accordingly, there has been room for improvement.

However, in the substrate holding device in Patent Literature 1, a sufficient attraction force cannot be applied to such a substrate, as a result of which such a substrate holding device may not provide satisfactory solutions. In addition, when a substrate curved into a concave shape is to be attracted, at the initial stage of attraction, a certain space (curved amount) exists in an outer peripheral rib and the rear surface of the substrate, and thus air flows in from an outer side of the base body. Here, at the same time that air flows in, particles or contaminants may be allowed to be introduced. In a substrate holding member, such as that in Patent Literature 2, whose outer peripheral region is shallow, introduced particles or contaminants may adhere to the rear surface of the substrate and the risk of interposition of the particles or contaminants between the rear surface of the substrate and an attraction surface is increased, as a result of which the flatness of the substrate may be reduced.

SUMMARY OF THE INVENTION

Accordingly, the present invention has been made in view of such circumstances, and it is an object of the present invention to provide a substrate holding member that is capable of attracting with good flatness even a bent or curved substrate.

To this end, in accordance with one aspect of the present invention, an exemplary substrate holding member includes a circular-plate-shaped base body that has a plurality of vent holes that open in an upper surface of the base body; a plurality of pin-shaped convex portions that are formed so as to protrude upward from the upper surface of the base body; and a ring-shaped convex portion that is formed so as to protrude upward from the upper surface of the base body in such a manner as to surround the plurality of pin-shaped convex portions, wherein at least a part of the pin-shaped convex portions that are arranged in an outer peripheral region situated on an outer side in a radial direction of the base body with respect to an imaginary circle are first pin-shaped convex portions that each include a first convex element and a second convex element, the imaginary circle being concentric with a center of the base body and passing through, of the plurality of vent holes, the vent hole that is closest to an outer periphery of the upper surface of the base body, the first convex element protruding upward from the upper surface of the base body, the second convex element protruding upward from an upper end surface of the first convex element and having an upper end surface whose area is smaller than an area of the upper end surface of the first convex element.

In this way, when at least a part of the plurality of pin-shaped convex portions arranged in the outer peripheral region situated on an outer side of the vent holes are the first pin-shaped convex portions (two-step pins), it is possible to attract with good flatness even a bent or curved substrate and to reduce the risk of a reduction in flatness caused by contamination of the substrate occurring due to production of particles and caused by interposition of the particles.

Of the plurality of pin-shaped convex portions, the pin-shaped convex portion that is disposed on an inner side in the radial direction of the base body with respect to the outer peripheral region may be a second pin-shaped convex portion that is formed with a columnar shape so as to protrude upward from the upper surface of the base body.

Due to this structure, an interception effect between a region including two-step pins and a region not including two-step pins is exhibited, and it is possible to further increase a negative pressure force in the outer peripheral region and in the central region and to attract with good flatness even a largely bent or curved substrate.

Then, the first pin-shaped convex portions may be formed in a circular-ring-shaped region having a certain width at the outer peripheral region, and, of the plurality of pin-shaped convex portions, the pin-shaped convex portion that is positioned on an outer side in the radial direction of the base body with respect to the circular-ring-shaped region may be the second pin-shaped convex portion.

In this way, by confining the two-step pins within the circular ring-shaped region, it is possible to decrease the number of two-step pins that are formed and to further reduce the risk of producing particles.

The pin-shaped convex portions may include a second pin-shaped convex portion that is formed with a columnar shape so as to protrude upward from the upper surface of the base body, and a maximum diameter of the upper end surface of each of the first convex elements may be larger than a maximum diameter of an upper end surface of the second pin-shaped convex portion.

Due to this structure, since the region including the two-step pins is such that a flow path space is sufficiently narrower than a flow path space of the region not including two-step pins, when a sucking operation of a substrate is performed, the flow velocity is high in the region including the two-step pins and the pressure is decreased, as a result of which a negative pressure amount is increased. As a result, the attraction force in the region including the two-step pins is increased and it is possible to attract with good flatness even a largely bent or curved substrate.

The pin-shaped convex portions may include a second pin-shaped convex portion that is formed with a columnar shape so as to protrude upward from the upper surface of the base body, and an area of an upper end surface of each of the first pin-shaped convex portions may be equal to an area of an upper end surface of the second pin-shaped convex portion.

Due to this structure, since the area of contact of a surface of each first pin-shaped convex portion with a substrate and the area of contact of a surface of the second pin-shaped convex portion with the substrate become equal to each other, it is possible to support the substrate in a balanced manner. Since the region including the two-step pins is such that the flow path space is narrower than the flow path space of the region not including two-step pins, the attraction force in the region including the two-step pins is increased and it is possible to attract with good flatness a curved substrate. In addition, by designing the first pin-shaped convex portions and the second pin-shaped convex portion with the same area, when a lapping operation or the like is performed on the pin surfaces, the loads become the same and the pin heights are easily adjusted.

A distance from the upper surface of the base body to an upper end surface of each of the plurality of pin-shaped convex portions may be 120 μm to 180 μm, and a distance from the upper surface of the base body to the upper end surface of each of the first convex elements may be 0.4 times to 0.6 times the distance from the upper surface of the base body to the upper end surface of each of the plurality of pin-shaped convex portions.

By setting the height of the pin-shaped convex portions and the height of the first convex elements in the aforementioned ranges, it is possible to ensure a negative pressure force by adjusting the volume of a negative pressure space and to increase the strength of the convex portions.

The base body may have a grooved portion that communicates with the vent holes and that opens in a lower surface of the base body.

Due to this structure, it is possible to divide a vacuum suction system into two systems, that is, a system for a stage and the base body and a system for the base body and a substrate and to apply a sufficient negative pressure force to a substrate-placement-surface side through the vent holes that communicate with the grooved portion.

BRIEF DESCRIPTION OF THE DRAWINGS

FIG. 2 is a cross-sectional view of the substrate holding member in a cross section along line II-II in FIG. 1.

FIG. 9 is a cross-sectional view of the substrate holding member in a cross section along line IX-IX in FIG. 8.

FIG. 13 shows a table of the conditions and evaluation results of pin-shaped convex portions of examples and pin-shaped convex portions of a comparative example.

DETAILED DESCRIPTION OF EXEMPLARY EMBODIMENTS OF THE INVENTION

Figure 1:
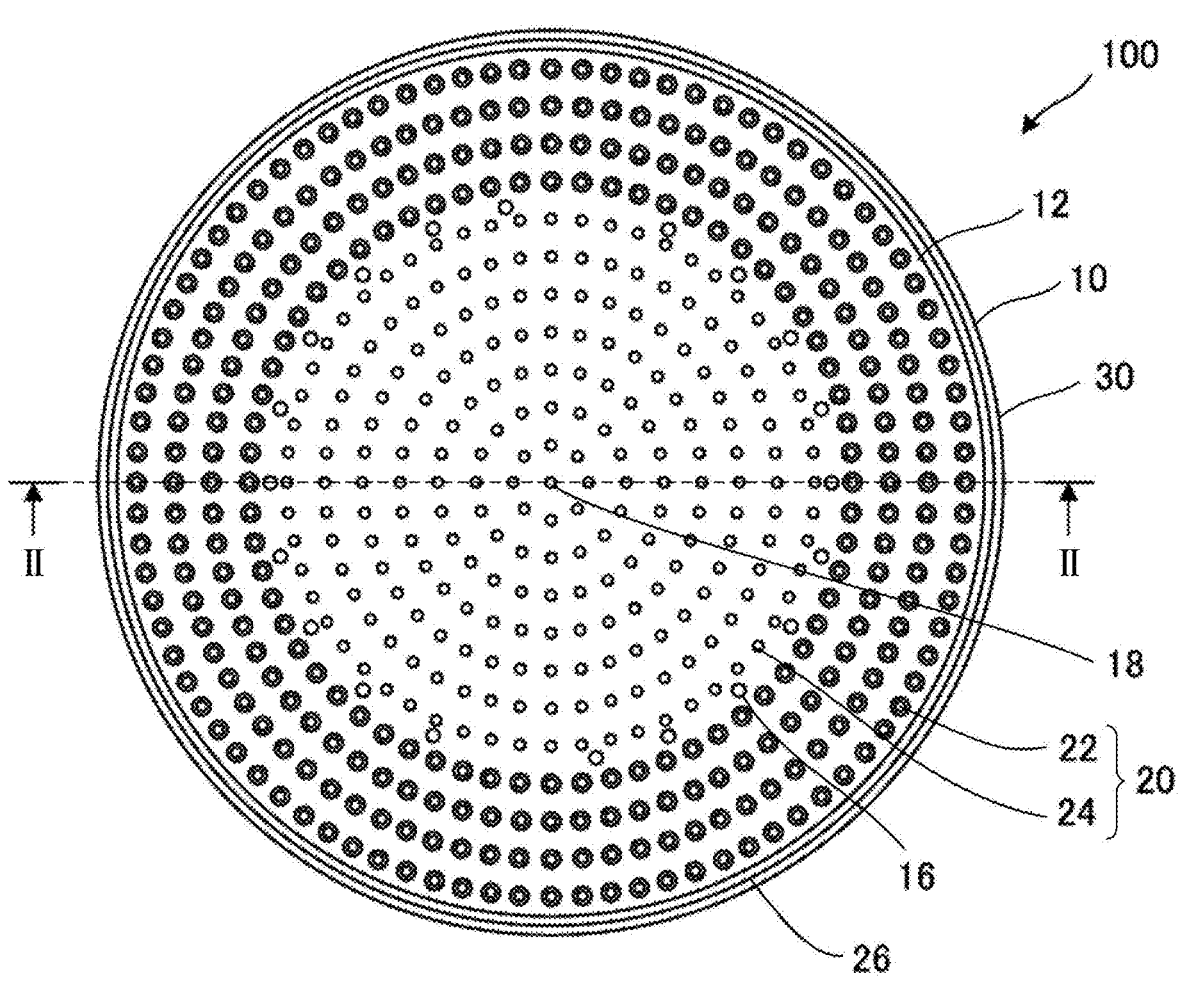
FIG. 1 is a schematic view showing an example of an upper surface of a substrate holding member according to an embodiment of the present invention.

Next, an embodiment of the present invention is described with reference to the drawings. To facilitate understanding of the description, the same reference numerals are given to structural elements that are the same in the FIGURES, and the same descriptions of such structural elements are not repeated. Note that, in the structural FIGURES, the size of each structural element is conceptually indicated and does not necessarily indicate the actual dimensional ratio.

EMBODIMENT

Figure 2:
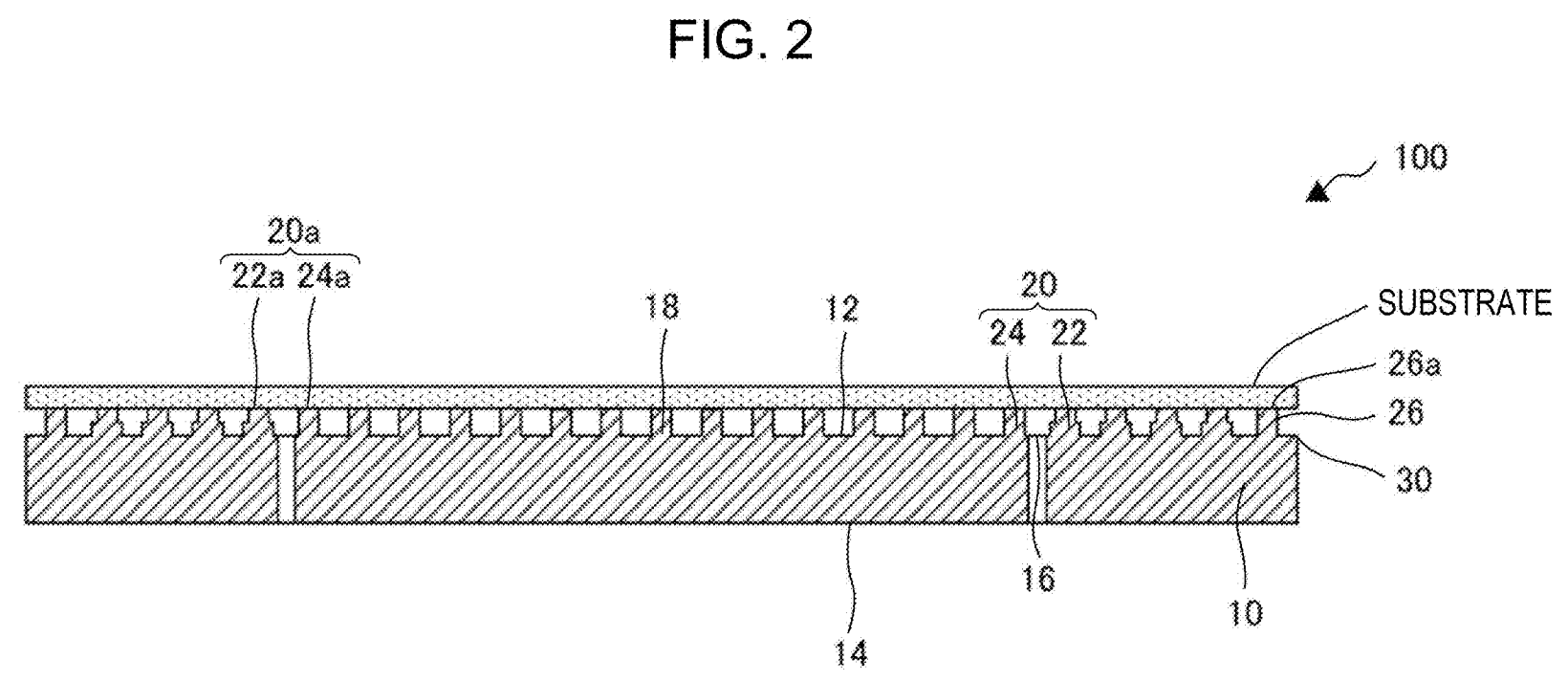

A substrate holding member according to an embodiment of the present invention is described with reference to FIGS. 1 and 2. FIG. 1 is a schematic view showing an example of an upper surface of the substrate holding member according to the embodiment of the present invention. FIG. 2 is a cross-sectional view of the substrate holding member in a cross section along line II-II in FIG. 1.

A substrate holding member 100 includes a base body 10 for attracting and holding a substrate (wafer). The base body 10 is formed from a ceramic sintered body formed into a substantially circular-flat-plate shape. The thickness of the base body 10, excluding convex portions and grooved portions (which are described later), is preferably 1.0 mm to 3.0 mm.

The base body 10 has a plurality of vent holes 16 that open in an upper surface 12. The vent holes 16 are connected to a suction hole (not shown) of a stage at a lower surface 14, and are connected to a vacuum suction device (not shown)

therethrough. The width or the diameter of each vent hole 16 is preferably 0.5 mm to 2.0 mm.

In FIGS. 1 and 2, 20 openings of the vent holes 16 exist in the upper surface 12 of the base body 10 and are arranged in a circular ring shape. However, the number of the openings of the vent holes 16 and the arrangement of the openings of the vent holes 16 are not limited thereto. For example, the openings of the vent holes 16 may be positioned at the center of the base body 10, or may be positioned at different distances from an outer periphery 30 of the upper surface 12 of the base body 10. The distance from a center 18 of the base body 10 to the centers of the vent holes 16 that are closest to the outer periphery 30 of the upper surface 12 of the base body 10 is preferably greater than or equal to 30% and more preferably greater than or equal to 50% of the distance from the center 18 of the base body 10 to the outer periphery 30. The distance from the center 18 of the base body 10 to the centers of the vent holes 16 that are closest to the outer periphery 30 of the upper surface 12 of the base body 10 is preferably less than or equal to 70% of the distance from the center 18 of the base body 10 to the outer periphery 30. In order to attract with good flatness a curved substrate, for the purpose of ensuring a negative pressure force in a balanced manner to the entire substrate, a plurality of vent holes 16 are preferably arranged near the center 18 of the base body 10 in a radial direction and symmetrically arranged at predetermined intervals in a peripheral direction at the same diameter.

A plurality of pin-shaped convex portions 20 are formed on the base body 10 so as to protrude upward from the upper surface 12 of the base body 10. The plurality of pin-shaped convex portions 20 support a substrate. Upper end surfaces 20a of the plurality of pin-shaped convex portions are formed to be substantially flush with each other. Therefore, the upper end surfaces 20a of the pin-shaped convex portions contact the substrate and support the substrate. Note that, of the plurality of pin-shaped convex portions 20, there may be a pin-shaped convex portion 20 whose upper end surface does not contact the substrate. This is because, even if such a convex portion exists, the substrate can be supported depending upon the arrangement of the pin-shaped convex portions 20 around such a convex portion. Note that, although in FIG. 2, the entire upper end surfaces 20a of the pin-shaped convex portions contact the substrate, only a part of the upper end surfaces 20a of the pin-shaped convex portions may contact the substrate.

The pin-shaped convex portions 20 may be regularly arranged in a triangular lattice arrangement, a rectangular lattice arrangement, or a concentrically circular arrangement, or may be irregularly arranged with locally high or low density. The maximum diameter of the upper end surface 20a of each pin-shaped convex portion is preferably 100 μm to 500 μm. The interval between adjacent pin-shaped convex portions 20 is such that a center-to-center distance is preferably 8 mm or less. The height of each pin-shaped convex portion 20 can be 50 μm to 200 μm. Note that the height of each pin-shaped convex portion 20 refers to the distance from the upper surface 12 to the upper end surface 20a of each pin-shaped convex portion.

At least a part of the pin-shaped convex portions 20 that are arranged in an outer peripheral region 34 situated on an outer side in a radial direction of the base body 10 with respect to an imaginary circle 32 are first pin-shaped convex portions 22 (two-step pins). The first pin-shaped convex portions 22 each include a first convex element 22b and a second convex element 22d. The first convex element 22b protruding upward from the upper surface 12 of the base body 10. The second convex element 22d protruding upward from an upper end surface 22c of the first convex element and having an upper end surface whose area is smaller than the area of the upper end surface 22c of the first convex element. The imaginary circle 32 being concentric with the center 18 of the base body and passing through the vent holes 16 that are closest to the outer periphery 30 of the upper surface 12 of the base body 10. Therefore, it is possible to attract with good flatness even a bent or curved substrate and to reduce the risk of a reduction in flatness caused by contamination of the substrate occurring due to production of particles and caused by interposition of the particles.

Figure 3:
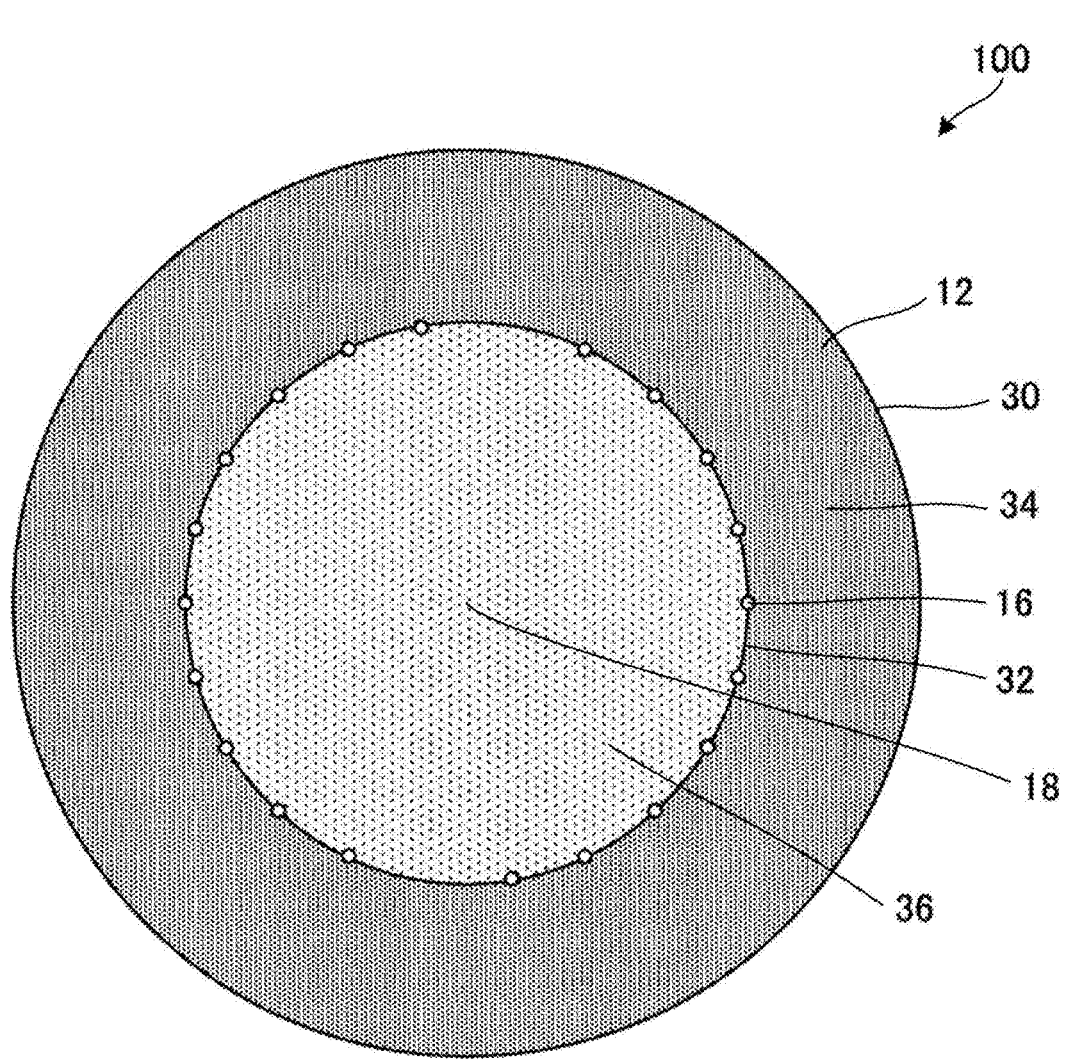
FIG. 3 is a schematic view showing an imaginary circle, an outer peripheral region, and a central region of an upper surface of a base body.

FIG. 3 is a schematic view showing the imaginary circle 32, the outer peripheral region 34, and a central region 36 of the upper surface 12 of the base body 10. Note that FIG. 3 does not show the pin-shaped convex portions 20 and a ring-shaped convex portion 26. The imaginary circle 32 passes through the centers of the vent holes 16 that are closest to the outer periphery 30 of the upper surface 12 of the base body 10. The pin-shaped convex portions 20 that are provided on both sides of the imaginary circle 32 are considered as being disposed in the outer peripheral region 34.

When the outer peripheral region 34 includes two-step pins, a flow path of this portion becomes narrower than that of the central region 36. By narrowing the flow path, the flow velocity is increased, and, by decreasing the pressure, a negative pressure amount is increased. Therefore, the attraction force is increased (Bernoulli theorem). Consequently, it is possible to attract a curved substrate. On the other hand, since a gap at each two-step pin is deep, particles that flow in from the outer periphery 30 or that are produced on the pin-shaped convex portions 20 of the base body 10 often fall into the gap at each two-step pin, as a result of which, compared to when the entire outer peripheral region 34 is shallow, it is possible to reduce the risk of a reduction in flatness caused by contamination of the substrate and caused by interposition of the particles.

Figure 4:
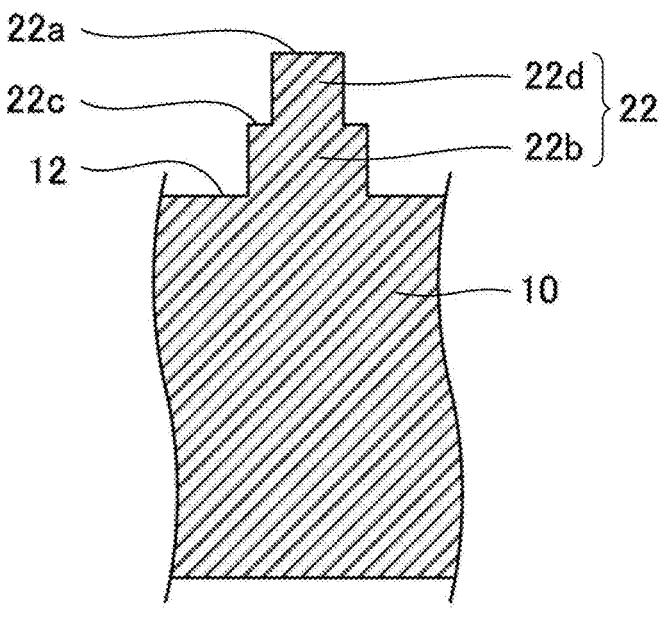
FIG. 4 is an enlarged cross-sectional view of a first pin-shaped convex portion in FIG. 2.

FIG. 4 is an enlarged cross-sectional view of a first pin-shaped convex portion 22 in FIG. 2. As shown in FIG. 4, the shape of the first convex element 22b and the shape of the second convex element 22d are each a columnar shape, and each columnar shape can be, for example, a circular columnar shape or a rectangular columnar shape. In a cross section perpendicular to the upper surface 12 of the base body 10, shapes, such as a circular conical trapezoidal shape and a pyramidal trapezoidal shape, in which an angle formed by the upper surface 12 of the base body 10 and a side surface of the first convex element 22b or an angle formed by the upper end surface 22c of the first convex element and a side surface of the second convex element 22d is larger than 90 degrees and 130 degrees or less, are considered to be columnar shapes. An upper end surface of the second convex element becomes an upper end surface 22a of the first pin-shaped convex portion. The first convex element 22b and the second convex element 22d are formed in a one-to-one correspondence. The maximum diameter of the upper end surface 22c of the first convex element is preferably 1.0 mm to 1.5 mm. The maximum diameter of the upper end surface of the second convex element (the upper end surface 22a of the first pin-shaped convex portion) is preferably 100 μm to 500 μm. The first pin-shaped convex portion 22 can be formed by, for example, blast processing, laser processing, or a combination thereof. The maximum diameter of the upper end surface 22c of the first convex element is preferably larger than the maximum diameter of an upper end surface 24a of the second pin-shaped convex portion. Therefore, since a region including the two-step pins is such that a flow path space is sufficiently narrower than a flow path space of a region not including two-step pins, when a sucking operation of a substrate is performed, the flow velocity is high in the region including the two-step pins and, by decreasing the pressure, a negative pressure amount is increased. As a result, the attraction force in the region including the two-step pins is increased and it is possible to attract with good flatness even a largely bent or curved substrate.

The pin-shaped convex portions 20 that are positioned on an inner side (the central region 36) in the radial direction of the base body 10 with respect to the outer peripheral region 34 are preferably second pin-shaped convex portions 24 that are formed with a columnar shape so as to protrude upward from the upper surface 12 of the base body 10. Therefore, an interception effect between the region including the two-step pins (the first pin-shaped convex portions 22) and the region not including two-step pins is exhibited, and it is possible to further increase a negative pressure force in the outer peripheral region 34 and in the central region 36 and to attract with good flatness even a largely bent or curved substrate. The interception effect refers to an effect in which, by providing two-step pins on an outer side of the vent holes 16, a gas inflow amount from the outer side is decreased and a gas flow on the outer side and a gas flow on an inner side of the vent holes 16 differ from each other, as a result of which the negative pressure of a vacuum pump at the central region 36 is directly applied. Therefore, the attraction force of the central region 36 is increased and thus the entire attraction force is increased.

Figure 5:
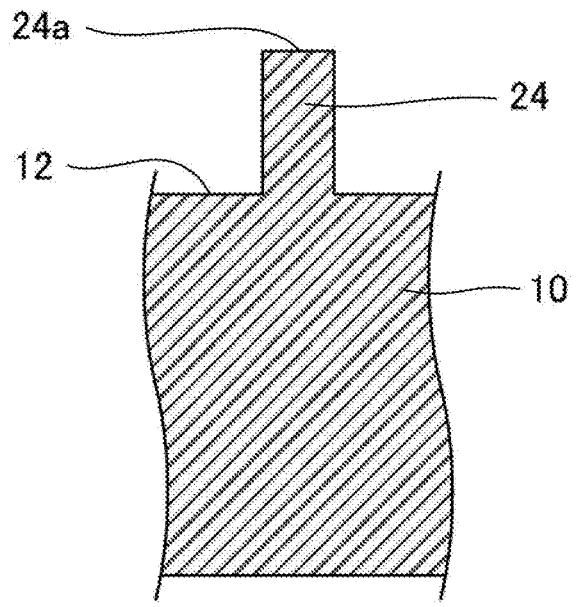
FIG. 5 is an enlarged cross-sectional view of a second pin-shaped convex portion in FIG. 2.

FIG. 5 is an enlarged cross-sectional view of a second pin-shaped convex portion 24 in FIG. 2. The shape of the second pin-shaped convex portion 24 is a single columnar shape, such as a circular columnar shape or a rectangular columnar shape. That is, unlike each first pin-shaped convex portion 22, each second pin-shaped convex portion 24 is not a two-step pin that includes a first convex element and a second convex element, the first convex element protruding upward from the upper surface 12 of the base body 10, the second convex element protruding upward from the upper end surface of the first convex element and having an upper end surface whose area is smaller than the area of the upper end surface of the first convex element. In a cross section perpendicular to the upper surface 12 of the base body 10, shapes, such as a single circular conical trapezoidal shape and a single pyramidal trapezoidal shape, in which an angle formed by the upper surface 12 of the base body 10 and a side surface of each second pin-shaped convex portion 24 is larger than 90 degrees and 130 degrees or less, are considered to be single columnar shapes. Here, the ratio of the maximum diameter of the upper end surface of each second pin-shaped convex portion 24 with respect to a maximum diameter of the lower end of each second pin-shaped convex portion 24 is preferably 0.55 to less than 1.00. The maximum diameter of the upper end surface 24a of each second pin-shaped convex portion is preferably 100 μm to 500 μm. The maximum diameter of the upper end surface 24a of each second pin-shaped convex portion is preferably equal to the maximum diameter of the upper end surface 22a of each first pin-shaped convex portion. The area of the upper end surface 22a of each first pin-shaped convex portion is preferably equal to the area of the upper end surface 24a of each second pin-shaped convex portion. Therefore, since the area of contact of the surfaces of the first pin-shaped convex portions 22 with a substrate and the area of contact of the surfaces of the second pin-shaped convex portions 24 with the substrate become equal to each other, it is possible to support the substrate in a balanced manner. Since the region including the two-step pins is such that the flow path space is narrower than the flow path space of the region not including two-step pins, the attraction force in the region including the two-step pins is increased and it is possible to attract with good flatness a curved substrate. In addition, by designing the first pin-shaped convex portions 22 and the second pin-shaped convex portions 24 with the same maximum diameter or the same area, when a lapping operation or the like is performed on the pin surfaces, the loads become the same and the pin heights are easily adjusted. The second pin-shaped convex portions 24 can be formed by, for example, blast processing, laser processing, or a combination thereof.

All or only a part of the pin-shaped convex portions 20 that are arranged in the outer peripheral region 34 may be the first pin-shaped convex portions 22. The pin-shaped convex portions 20 that are arranged in the central region 36 may include first pin-shaped convex portions 22. Although all of the pin-shaped convex portions 20 may be first pin-shaped convex portions 22, since the first pin-shaped convex portions 22 are such that the distance between a substrate and the upper end surface 22c of each first convex element is decreased, the risk of a reduction in flatness caused by contamination of the substrate occurring due to production of particles and caused by interposition of the particles is increased in proportion to the number of first pin-shaped convex portions 22. Therefore, the pin-shaped convex portions 20 that are arranged in the central region 36 are preferably second pin-shaped convex portions 24.

The distance from the upper surface 12 of the base body 10 to the upper end surface 20a of each of the plurality of pin-shaped convex portions is preferably 120 μm to 180 μm. That is, the height of each pin-shaped convex portion 20 is 120 μm to 180 μm. The distance from the upper surface 12 of the base body 10 to the upper end surface 22c of each first convex element is preferably 0.4 times to 0.6 times the distance from the upper surface 12 of the base body 10 to the upper end surface 20a of each of the plurality of pin-shaped convex portions. Therefore, it is possible to ensure a negative pressure force by adjusting the volume of a negative pressure space and to increase the strength of the convex portions.

The ring-shaped convex portion 26 is formed on the base body 10 so as to protrude upward from the upper surface 12 of the base body 10 in such a manner as to surround the plurality of pin-shaped convex portions 20. The ring-shaped convex portion 26 is formed along the outer periphery 30 of the upper surface 12. In FIG. 1, the ring-shaped convex portion 26 is continuously formed in a circular ring shape when seen from thereabove toward a slightly central side from the outer periphery 30 of the base body 10. A part of the pin-shaped convex portions 20 may be disposed on an outer side of the ring-shaped convex portion 26.

An upper end surface 26a of the ring-shaped convex portion may be formed closer to the upper surface 12 of the base body 10 than the upper end surface 20a of each pin-shaped convex portion. That is, the height of the ring-shaped convex portion 26 may be smaller than the height of each pin-shaped convex portion 20. Here, the height of the ring-shaped convex portion 26 is preferably smaller than the height of each pin-shaped convex portion 20 by 1 μm to 5 μm. Therefore, since the contact area between the base body 10 and a substrate is decreased, it is possible to reduce the risk of a reduction in profile irregularity caused by production of particles and interposition of the particles. The height of the ring-shaped convex portion 26 and the height of each pin-shaped convex portion 20 may have a relationship in which the ring-shaped convex portion 26 is substantially flush with each pin-shaped convex portion 20. When the ring-shaped convex portion 26 is substantially flush with the plurality of pin-shaped convex portions 20, a negative-pressure space is brought into a hermetically sealed state, as a result of which a suction force is increased. Therefore, it is possible to attract with good flatness a largely bent or curved substrate.

Figure 6:
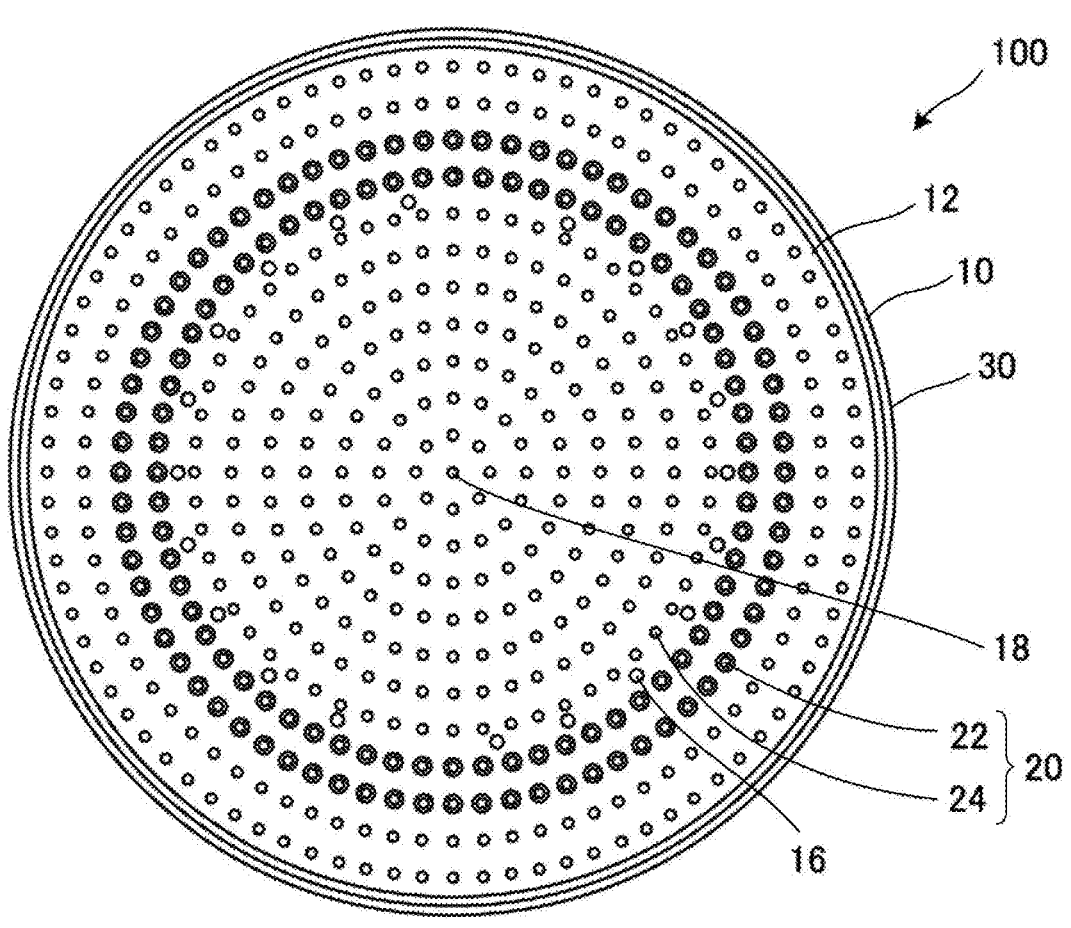
FIG. 6 is a schematic view showing an example of an upper surface of the substrate holding member according to a modification of the embodiment of the present invention.
Figure 7:
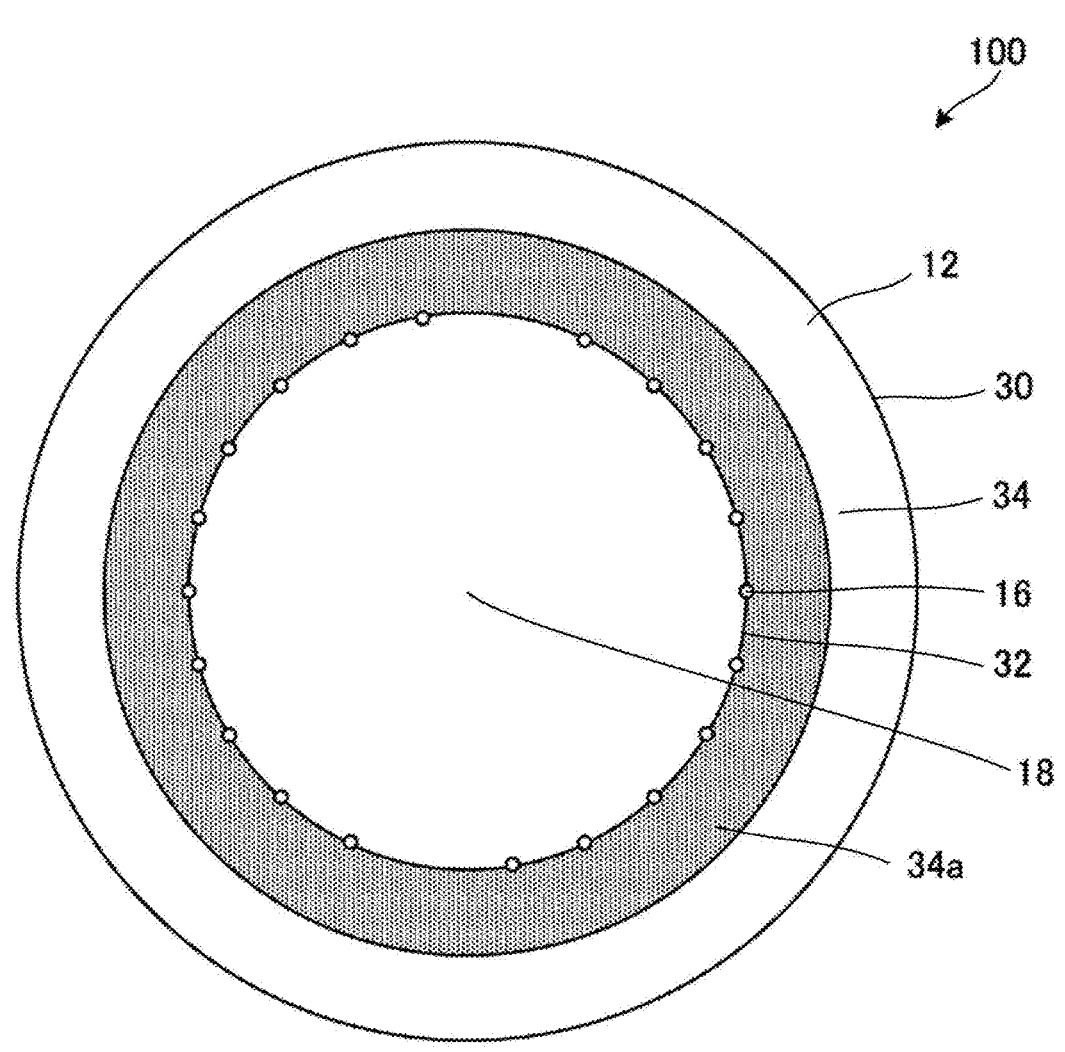
FIG. 7 is a schematic view showing an imaginary circle, an outer peripheral region, and a circular-ring-shaped region of the upper surface of the base body.

FIG. 6 is a schematic view showing a modification of an upper surface of the substrate holding member according to the embodiment of the present invention. FIG. 7 is a schematic view showing the imaginary circle 32, the outer peripheral region 34, and a circular-ring-shaped region 34a of the upper surface 12 of the base body 10. Note that FIG. 7 does not show the pin-shaped convex portions 20 and the ring-shaped convex portion 26. As shown in FIGS. 6 and 7, each first pin-shaped convex portion 22 is formed in the circular-ring-shaped region 34a having a certain width at the outer peripheral region 34, and the pin-shaped convex portions 20 that are positioned on the inner side and the outer side in a radial direction of the base body 10 with respect to the circular-ring-shaped region 34a are preferably second pin-shaped convex portions 24 that are formed with a columnar shape so as to protrude upward from the upper surface 12 of the base body 10. Therefore, it is possible to decrease the number of two-step pins that are formed and to further reduce the risk of producing particles. When the width of the outer peripheral region 34 is 1, the circular-ring-shaped region 34a preferably has a width of 0.2 to 0.5 in a radial direction from the imaginary circle 32.

Figure 8:
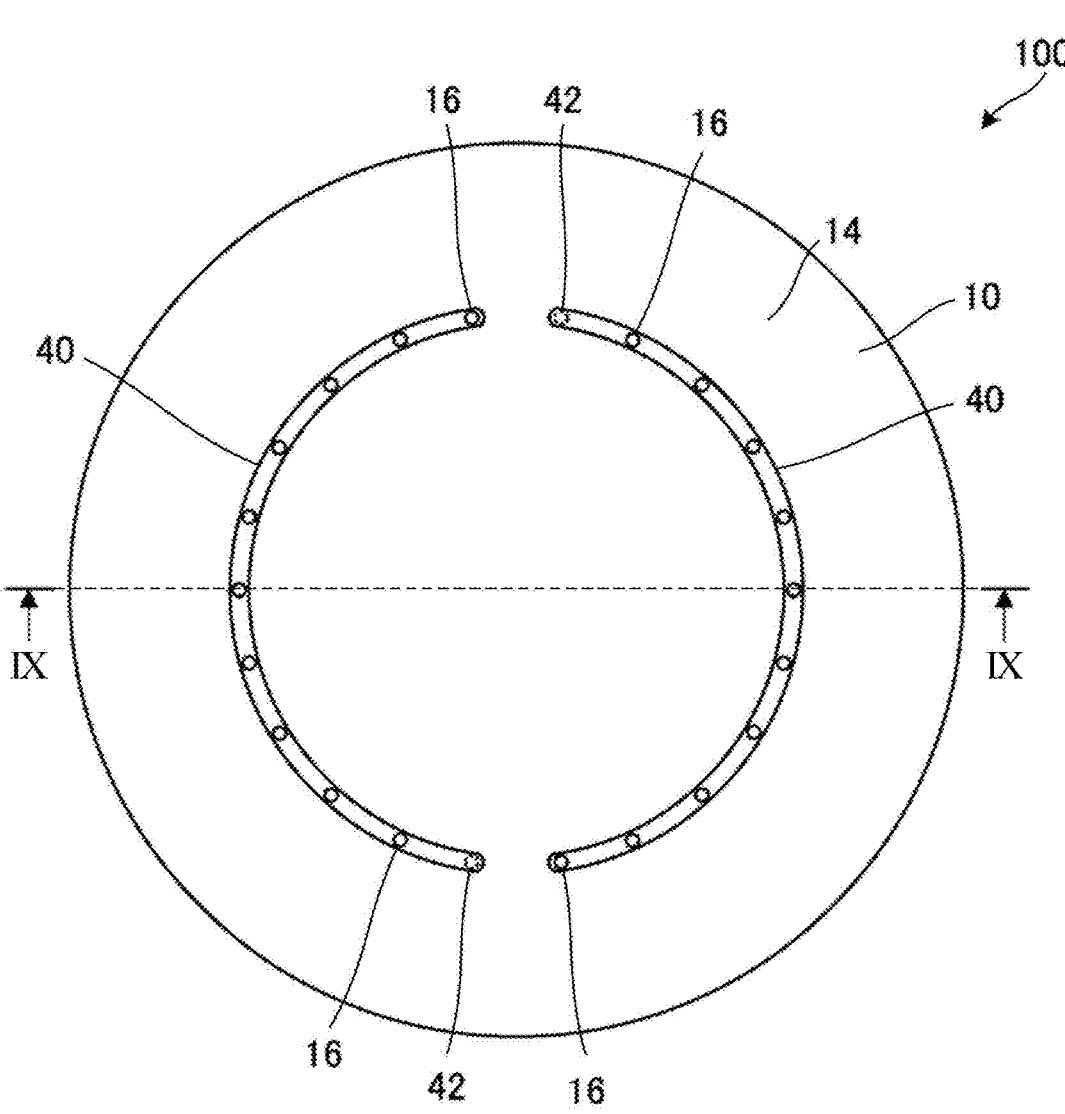
FIG. 8 is a schematic view showing an example of a lower surface of the substrate holding member according to a modification of the embodiment of the present invention.
Figure 9:
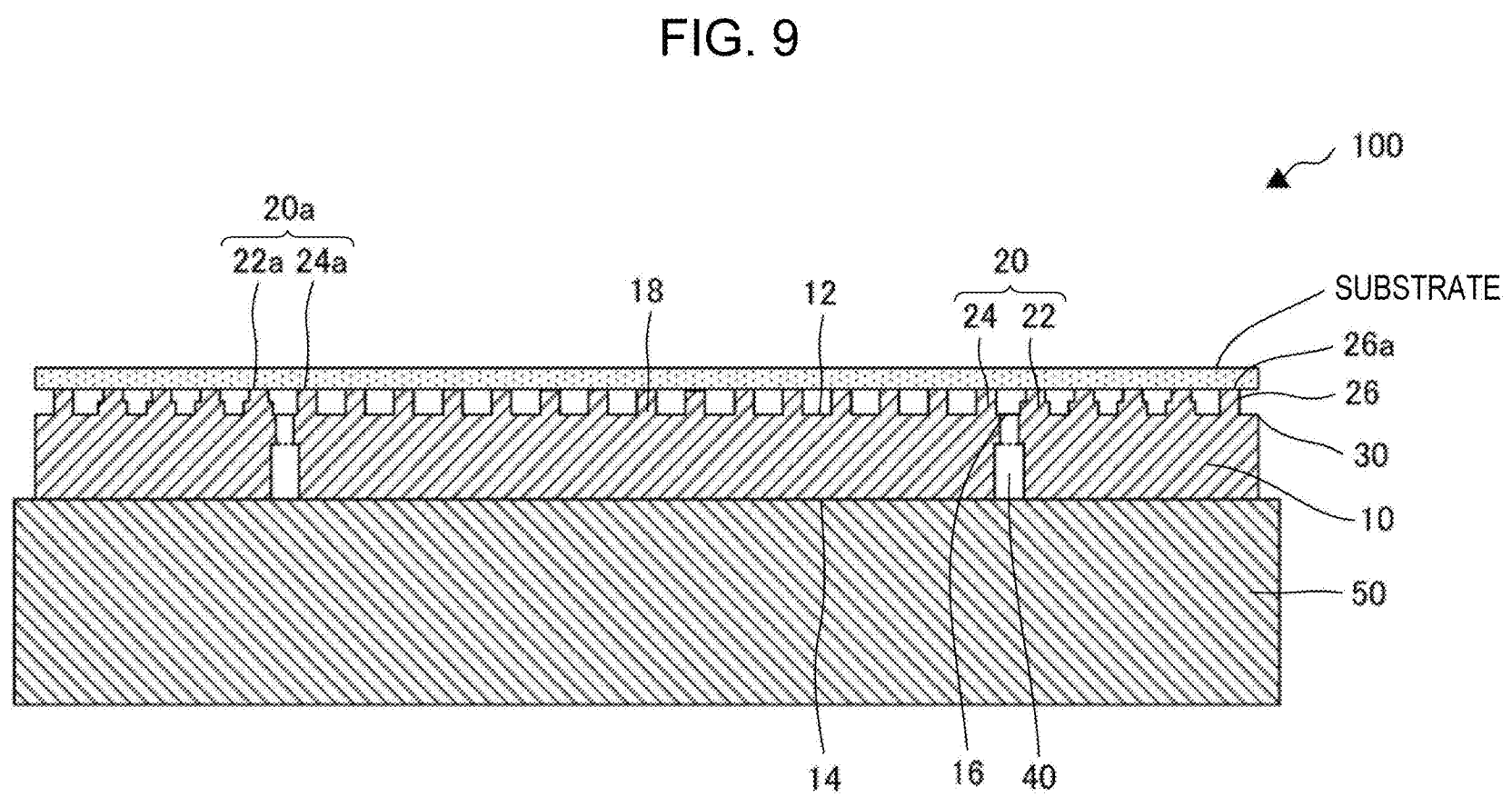

FIG. 8 is a schematic view showing a modification of a lower surface of the substrate holding member according to the embodiment of the present invention. FIG. 9 is a cross-sectional view of the substrate holding member in a cross section along line IX-IX in FIG. 8. FIG. 9 also shows a stage 50 on which the substrate holding member 100 is placed and a placed substrate. As shown in FIGS. 8 and 9, the base body 10 preferably has grooved portions 40 that open in the lower surface 14. When the base body 10 has grooved portions 40, the vent holes 16 communicate with the grooved portions 40 that open in the lower surface 14. The vent holes 16 and the grooved portions 40 may communicate with each other through a vent path passing the inside of the base body 10. When the base body 10 has the grooved portions 40, the grooved portions 40 are such that a suction hole (not shown) of the stage 50 is connected to a connection portion 42, and are connected to a vacuum suction device (not shown) through the connection portion 42.

By forming the grooved portions 40 that are in the form of a line in the base body 10, a system that attracts a substrate to the substrate holding member 100 and a system that attracts the substrate holding member 100 to the stage 50 can be separated from each other. This makes it possible to reduce bending or positional displacement of a substrate surface after the attraction.

Although, in FIG. 8, the grooved portions 40 are two arc-shaped grooved portions that are formed in a peripheral direction of the base body 10, the number of grooved portions 40 may be one or three or more. The arrangement and shape of the grooved portions 40 may be a linear arrangement and shape extending in a radial direction from near the center of the base body 10 or an arc arrangement and shape extending in a peripheral direction. In addition, the arrangement and shape of the grooved portions 40 may be other linear arrangements and shapes, a curved arrangement and shape, or a combination thereof. The grooved portions 40 may be branched at intermediate portions thereof.

Although the cross-sectional area of each grooved portion 40 in a direction perpendicular to a flow path direction is not particularly limited, the cross-sectional area is preferably 1.2 mm 2 or greater, and is more preferably 1.8 mm 2 or greater. In this way, when the cross-sectional area of each grooved portion 40 in the direction perpendicular to the flow path direction is 1.2 mm 2 or greater, the pressure loss of the flow path is reduced and the negative pressure force for attracting a substrate is increased, as a result of which it is possible to attract with good flatness even a largely bent or curved substrate and to suppress occurrence of variations in, for example, positional displacements. The cross-sectional area of each grooved portion 40 is preferably 2.8 mm 2 or less.

Figure 10:
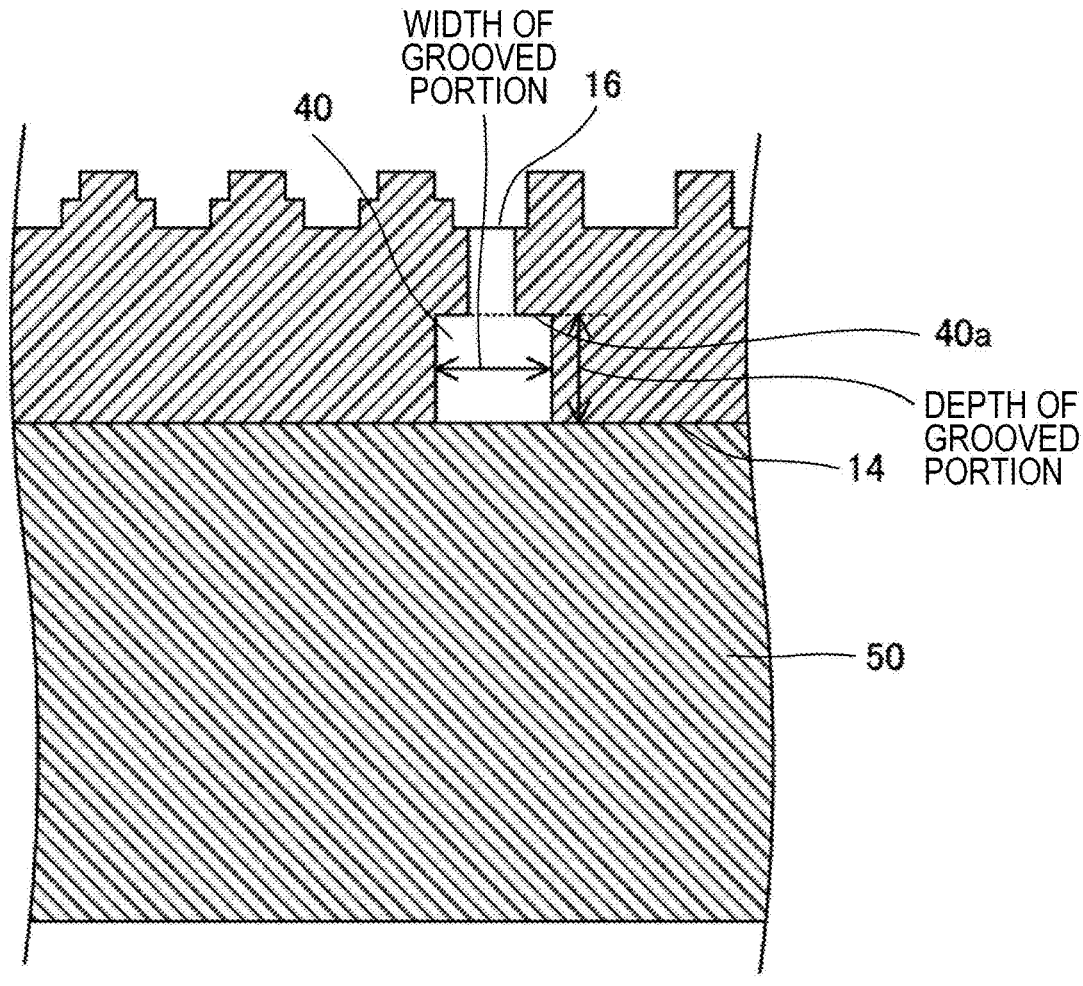
FIG. 10 is a partial enlarged view of FIG. 9.

FIG. 10 is a partial enlarged view of FIG. 9. For example, as shown in FIG. 10, when the lower surface 14 of the base body 10 and an upper surface of the stage 50 contact each other and when a cross section of a grooved portion 40 in the direction perpendicular to the flow path direction has a substantially rectangular shape, the cross-sectional area of the grooved portion 40 in the direction perpendicular to the flow path direction can be calculated by the product of a width of the grooved portion 40 and a depth of the grooved portion 40. When the cross-sectional shape of the grooved portion 40 in the direction perpendicular to the flow path direction is a shape other than a rectangular shape, the area of a cross section of a space surrounded by an upper end surface 40a of the grooved portion, a side surface of the grooved portion 40, and the upper surface of the stage 50 is the cross-sectional area of the grooved portion 40.

Each grooved portion 40 is preferably designed such that its depth is included in a range of ratio of 0.4 to 0.6 with respect to the thickness of the base body 10. For example, when the thickness of the base body 10 is 1 mm, each grooved portion 40 is preferably designed such that its depth is included in the range of 0.4 mm to 0.6 mm. The width of each grooved portion 40 is preferably 1.7 mm to 4.0 mm, and is more preferably 2.0 mm to 3.5 mm. Therefore, it is possible to provide a cross-sectional area that increases a negative pressure force while reducing the risk of damaging the base body 10. The depth of each grooved portion 40, excluding the connection portion 42 and the like, is preferably a certain value. The width of each grooved portion 40, excluding an end portion and a branching portion, is preferably a certain value.

A ratio of an area of an opening portion of each grooved portion 40 with respect to the area of the lower surface 14 of the base body 10 in plan view differs depending upon the width and the length of each grooved portion 40, the number of vent holes 16, and the arrangement of the vent holes 16. However, the ratio is preferably, for example, 1% or greater, and is more preferably, for example, 3% or greater. In addition, the ratio of the area of the opening portion of each grooved portion 40 with respect to the area of the lower surface 14 of the base body 10 in plan view is preferably, for example, 20% or less, and is more preferably, for example, 10% or less.

Figure 11A:
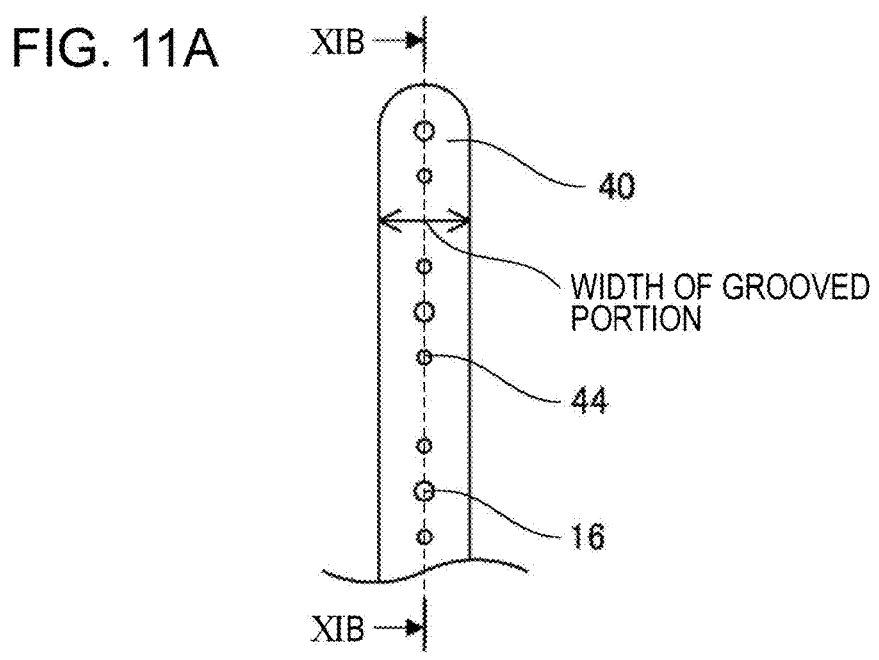
FIG. 11A is a partial schematic view showing a modification of a grooved portion in the lower surface of the substrate holding member according to the embodiment of the present invention.
Figure 11B:
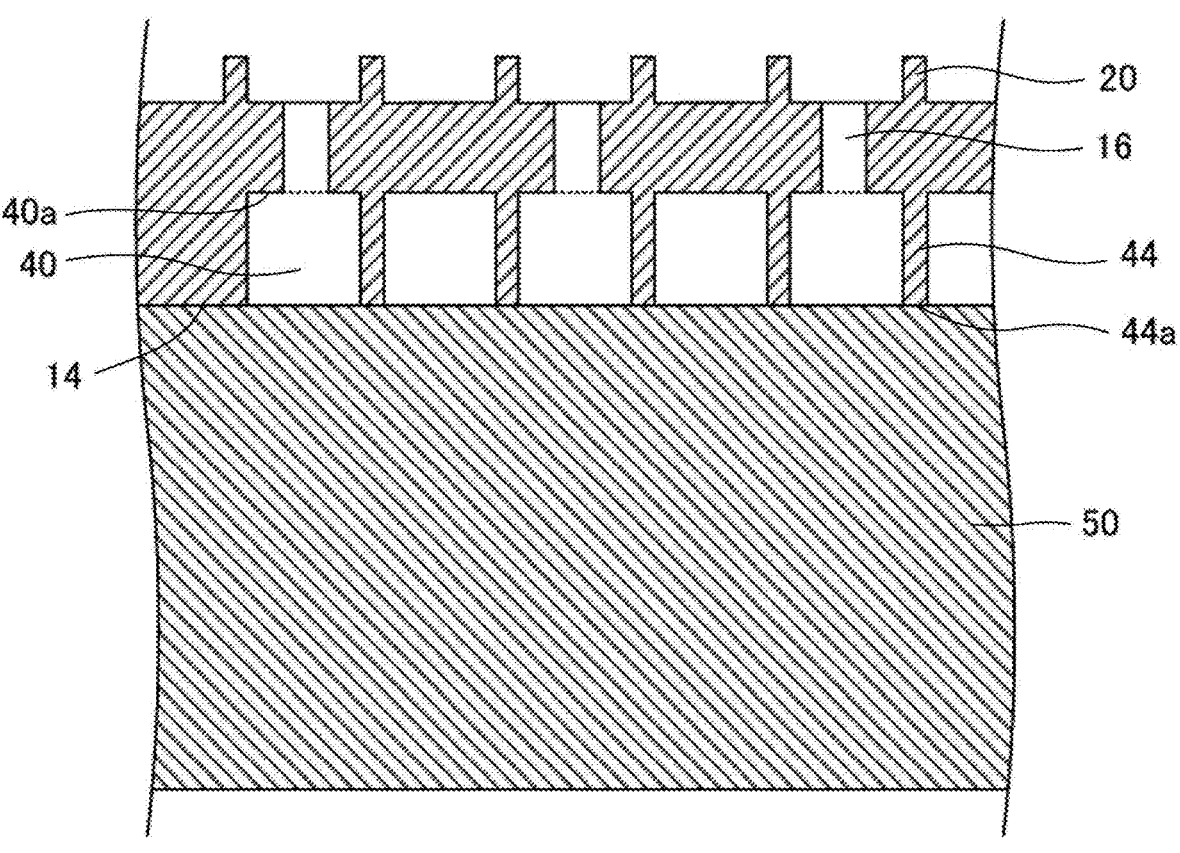
FIG. 11B is a partial cross-sectional view of the substrate holding member in a cross section along line XIB-XIB in FIG. 11A.

FIG. 11A is a partial schematic view showing a modification of a grooved portion in the lower surface of the substrate holding member according to the embodiment of the present invention. FIG. 11B is a partial cross-sectional view of the substrate holding member in a cross section along line XIB-XIB in FIG. 11A. As shown in FIGS. 11A and 11B, the base body 10 preferably has inside the grooved portion 40 a plurality of in-groove pin-shaped convex portions 44 that are formed so as to protrude downward from the upper end surface 40a of the grooved portion. Here, lower ends 44a (points or surfaces of top portions) of the plurality of in-groove pin-shaped convex portions are preferably formed with heights that allow them to be substantially flush with the lower surface 14. Therefore, since the base body 10 and the stage 50 contact each other at and are supported by the in-groove pin-shaped convex portions 44 even in the grooved portion 40, it is possible to suppress local deformation of the base body 10 and to increase the flatness accuracy of the substrate. Note that, when a plurality of lower-surface pin-shaped convex portions (described below) are formed, the lower ends 44a of the plurality of in-groove pin-shaped convex portions are preferably formed with heights that allow them to be substantially flush with lower ends of the plurality of lower-surface pin-shaped convex portions. Note that, although all of the plurality of pin-shaped convex portions 20 in FIG. 11B are second pin-shaped convex portions 24, when a plurality of pin-shaped convex portions 20 are formed on the upper surface 12 where the grooved portions 40 are provided, first pin-shaped convex portions 22 or second pin-shaped convex portions 24 may be formed in accordance with the arrangement of pin-shaped convex portions 20 on the upper surface.

Each in-groove pin-shaped convex portion 44 preferably has a shape that does not hinder vacuum drawing inside each grooved portion 40. For example, the in-groove pin-shaped convex portions 44 each preferably have a steep-sided circular conical trapezoidal shape having a base angle of 70 degrees to 85 degrees and preferably 75 degrees to 80 degrees and having a high aspect ratio. Such in-groove pin-shaped convex portions 44 can be formed by laser processing. However, the shape of each in-groove pin-shaped convex portion 44 is not limited to a circular conical trapezoidal shape and may be a circular columnar shape, a pyramidal shape, or other shapes. When the in-groove pin-shaped convex portions 44 are formed in each grooved portion 40, the width of each grooved portion is to be determined at locations where the in-groove pin-shaped convex portions are not formed.

The in-groove pin-shaped convex portions 44 are preferably arranged when the width of each grooved portion 40 is 2.0 mm or greater. That is, when the distance in a width direction of each grooved portion 40 between a side surface of each grooved portion 40 and the center of each in-groove pin-shaped convex portion 44 corresponding thereto can be made 1.0 mm or greater, the in-groove pin-shaped convex portions 44 are preferably formed.

Figure 12A:
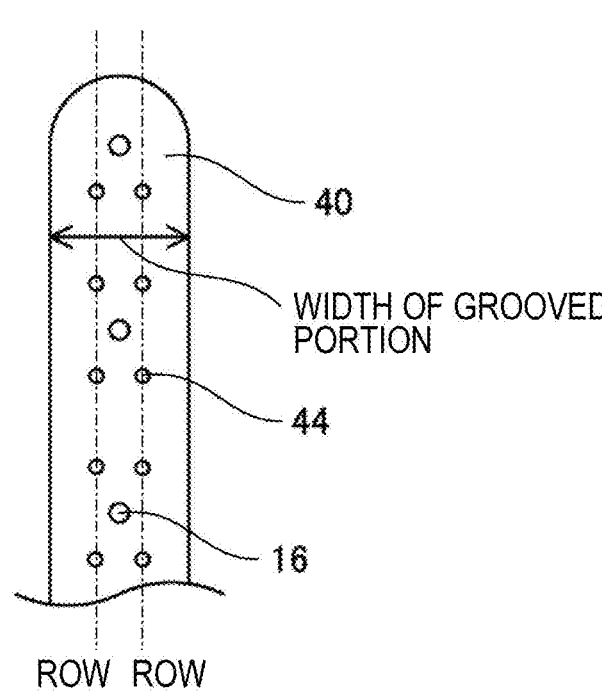
FIGS. 12A and 12B are each a partial schematic view showing a modification of a grooved portion in the lower surface of the substrate holding member according to the embodiment of the present invention.
Figure 12B:
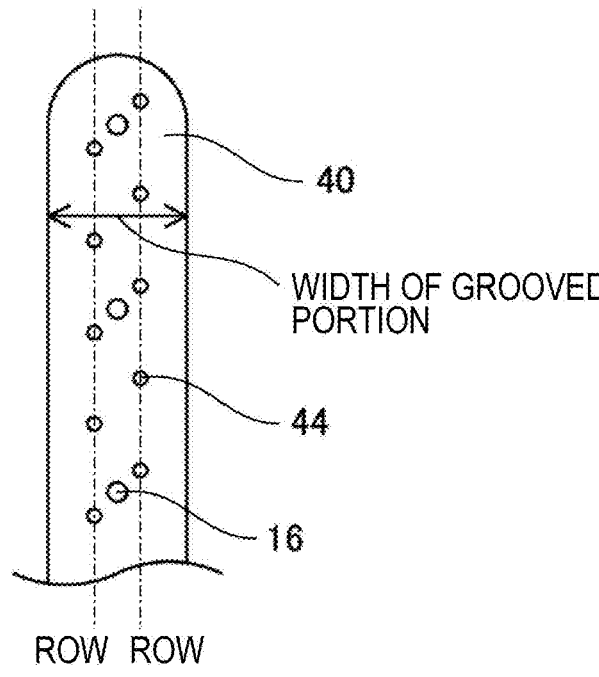

FIGS. 12A and 12B are each a partial schematic view showing a modification of a grooved portion in the lower surface of the substrate holding member according to the embodiment of the present invention. As shown in FIGS. 12A and 12B, when the width of a grooved portion 40 is sufficiently large, two or more rows of the in-groove pin-shaped convex portions 44 may be formed inside the grooved portion 40. When the in-groove pin-shaped convex portions 44 are formed in two or more rows, the in-groove pin-shaped convex portions 44 may be arranged side by side in the width direction of the grooved portion 40, or the in-groove pin-shaped convex portions 44 may not be arranged side by side in the width direction of the grooved portion 40. The in-groove pin-shaped convex portions 44 may be arranged in a row in a central-line direction of the grooved portion 40, the in-groove pin-shaped convex portions 44 may be arranged based on the arrangement of the lower-surface pin-shaped convex portions (described later), or the in-groove pin-shaped convex portions 44 may be randomly arranged.

For the purpose of decreasing a contact ratio between the stage 50 and the base body 10 (the lower surface 14) and reducing the risk of interposition of particles or the like, a plurality of lower-surface pin-shaped convex portions and a lower-surface ring-shaped convex portion may be formed on the lower surface 14 as with the upper surface 12. In this case, the plurality of lower-surface pin-shaped convex portions are each a one-step pin.

Method of Manufacturing Substrate Holding Member

By performing a well-known method, a disk-shaped molded product is formed from raw-material powder, and the molded product is subjected to firing to thereby obtain a ceramic sintered body. For the ceramic sintered body, for example, silicon carbide, aluminum oxide, silicon nitride, or aluminum nitride is used.

In accordance with the design of a substrate holding member, a plurality of pin-shaped convex portions, a ring-shaped convex portion, and vent holes are formed on or in an upper surface of the ceramic sintered body. Further, grooved portions that communicate with the vent holes and in-groove pin-shaped convex portions are formed in or on a lower surface of the ceramic sintered body. As a formation method thereof, for example, blast processing, milling processing, or laser processing is possible.

In accordance with the design of the substrate holding member, at least a part of the pin-shaped convex portions that are arranged in an outer peripheral region situated on an outer side in a radial direction of a base body with respect to an imaginary circle are formed as first pin-shaped convex portions that each include a first convex element and a second convex element. The imaginary circle being concentric with the center of the base body and passing through the vent holes that are closest to an outer periphery of an upper surface of the base body. The first convex element protruding upward from the upper surface of the base body, the second convex element protruding upward from an upper end surface of the first convex element and having an upper end surface whose area is smaller than the area of the upper end surface of the first convex element. Pin-shaped convex portions other than the first pin-shaped convex portions are formed as second pin-shaped convex portions that are each formed with a columnar shape so as to protrude upward from the upper surface of the base body.

For example, the arrangement, the shape, and the protrusion height of the plurality of pin-shaped convex portions are not particularly limited, and thus the plurality of pin-shaped convex portions may be of a well-known form or of a form similar thereto. For example, they may be regularly arranged in a triangular lattice arrangement, a rectangular lattice arrangement, or a concentrically circular arrangement, or may be irregularly arranged with locally high or low density. The height and the like can be set in accordance with the conditions for, for example, a substrate to be attracted; for example, the protrusion amount is 50 μm to 200 μm, the diameter of each upper end surface is 500 μm or less, and the pin-shaped-convex-portion-to-pin-shaped-convex portion interval is 8 mm or less.

In this way, the substrate holding member of the present invention can be manufactured.

EXAMPLES AND COMPARATIVE EXAMPLE

Example 1

As a substrate holding member of Example 1, a plurality of pin-shaped convex portions and a substantially circular ring-shaped rib (ring-shaped convex portion) that surrounds the plurality of pin-shaped convex portions were formed on an upper surface (substrate holding surface) of a substantially disk-shaped base body formed from a sintered body of silicon carbide and having a diameter $\phi$ of 310 mm and a thickness t of 1.2 mm. In addition, twenty vent holes having a hole diameter $\phi$ of 0.6 mm were formed at equal intervals in a peripheral direction at locations in correspondence with a PCD of 200 mm. Further, two arc-shaped grooved portions having a length of 300 mm and extending in a peripheral direction were formed in a lower surface of the base body at locations where the vent holes were arranged such that the grooved portions each communicated with ten vent holes. The two grooved portions each had a width of 2.0 mm and a depth of 0.6 mm, and the cross-sectional area of each grooved portion in a direction perpendicular to a flow path direction was 1.2 mm$^2$.

The plurality of pin-shaped convex portions were arranged in a triangular lattice arrangement in which a center-to-center distance between upper end surfaces was 4.0 mm. The plurality of pin-shaped convex portions were such that all of the pin-shaped convex portions situated on an outer side (outer peripheral side) in a radial direction with respect to the vent holes were formed as first pin-shaped convex portions. A diameter $\phi$ and a height t of a first convex element of each first pin-shaped convex portion were 1.2 mm and 0.075 mm, respectively, and a diameter $\phi$ and a height t of a second convex element of each first pin-shaped convex portion were 0.2 mm and 0.075 mm, respectively. All of the pin-shaped convex portions arranged on an inner side (central side) in a radial direction with respect to the vent holes were formed as second pin-shaped convex portions. A diameter $\phi$ and a height t of each second pin-shaped convex portion were 0.2 mm and 0.15 mm, respectively. That is, the diameter of an upper end surface of each first convex element was larger than the diameter of an upper end surface of each second pin-shaped convex portion. The area of the upper end surface of each first pin-shaped convex portion is equal to the area of the upper end surface of each second pin-shaped convex portion. The ring-shaped convex portion was formed with a height that was 3 $\mu$m lower than the height of each of the plurality of pin-shaped convex portions. In this way, the substrate holding member of Example 1 was formed.

Example 2

A substrate holding member of Example 2 was formed under conditions similar to those of Example 1, except that, when a linear distance to the vent holes closest to an outermost diameter of the base body was 1, only portions having a width of 0.2 in an outer diameter direction from the center of each vent hole included first pin-shaped convex portions.

Example 3

A substrate holding member of Example 3 was formed under conditions similar to those of Example 1, except that all of the pin-shaped convex portions were formed as first pin-shaped convex portions.

Example 4

A substrate holding member of Example 4 was formed under conditions similar to those of Example 1, except that a first convex element of each first pin-shaped convex portion had a height t of 0.05 mm, and a second convex element of each first pin-shaped convex portion had a height t of 0.1 mm.

Example 5

A substrate holding member of Example 5 was formed under conditions similar to those of Example 1, except that a first convex element of each first pin-shaped convex portion had a height t of 0.1 mm, and a second convex element of each first pin-shaped convex portion had a height t of 0.05 mm.

Comparative Example 1

A substrate holding member of Comparative Example 1 was formed under conditions similar to those of Example 1, except that all of the pin-shaped convex portions were formed as second pin-shaped convex portions.
Evaluation Method As substrates to be attracted, substrates (silicon wafers) having a diameter $\phi$ of 300 mm and a thickness t of 0.7 mm were prepared. Note that, as substrates to be attracted, a substrate having a flatness (curve) of 0.4 mm and a substrate having a flatness (curve) of 0.8 mm were prepared. The substrates were each attracted to each of the prepared substrate holding members, and the attractions were evaluated. The flatness of each of the attracted substrates was confirmed by using a non-contact laser interferometer. For the flatness, a PV value of a rectangular region of each held substrate, any one side of the rectangle being 20 mm, was measured, and the PV value was a local flatness (LF). When the LF was 0.1 $\mu$m or less, it was determined that the substrate had a particularly good flatness (excellent); when the LF was greater than 0.1 $\mu$m and was 0.3 $\mu$m or less, it was determined that the substrate had good flatness (good); and when the LF was greater than 0.3 $\mu$m, it was determined that the substrate had bad flatness (poor). FIG. 13 shows a table of the conditions and evaluation results of the pin-shaped convex portions of the examples and the pin-shaped convex portions of the comparative example.
Evaluation Results Even with regard to the substrate holding members of Examples 1 to 5 and Comparative Example 1, it was confirmed that the substrate having a flatness (curve) of 0.4 mm could be attracted. In Examples 1 and 2, the flatness was 0.1 $\mu$m or less at all locations on the substrate.

In Examples 3 to 5, the flatness was greater than 0.1 $\mu$m and 0.3 $\mu$m or less. This is thought to be because, in Example 3 in which all of the pin-shaped convex portions were formed as first pin-shaped convex portions and in Example 5 in which the height of each first convex element was large, particles were interposed in a part of the first pin-shaped convex portions. In addition, this is thought to be because, in Example 4 in which the height of each first convex element was small, a negative pressure force was slightly weak and the attraction was not very well balanced.

With regard to the substrate holding members of Examples 1 to 3 and 5, it was confirmed that even the substrate having a flatness (curve) of 0.8 mm could be attracted. In particular, in Examples 1 and 2, it was found that, since even the flatness values were also excellent, at least a part of the pin-shaped convex portions situated on the outer side of the vent holes only need to be formed as first pin-shaped convex portions. Note that, although, in Example 2, it was confirmed that a part of measured portions had a flatness of greater than 0.1 μm and 0.3 μm or less, the number of such portions were fewer than that of Example 3.

In Comparative Example 1 in which all of the pin-shaped convex portions were formed as second pin-shaped convex portions, although the substrate having a flatness (curve) of 0.4 mm could be attracted, a part of measured portions had a flatness greater than 0.3 μm. This is thought to be because a negative pressure force is weaker than that in Example 4 and the attraction was not well balanced. The substrate holding members of Example 4 and Comparative Example 1 could not attract the substrate having a flatness (curve) of 0.8 mm. This is assumed to be because an attraction force allowing the substrate having a flatness (curve) of 0.8 mm to be attracted could not be applied.

The results above show that the substrate holding member of the present invention is capable of attracting with good flatness even a bent or curved substrate.

The present invention is not limited to the embodiment above, and it goes without saying that various modifications and equivalents are included within the scope of the present invention. The structures, the shapes, the number, the locations, the sizes, and the like of the structural elements shown in each figure are those for convenience of explanation, and may be changed as appropriate.

What is claimed is:

1. A substrate holding member comprising:
a base body having a circular plate shape and including a center, an outer peripheral region, and an upper surface, the upper surface including an outer periphery, the base body defining a plurality of vent holes that open in the upper surface, including a vent hole closest to the outer periphery, an imaginary circle being concentric with the center and passing through the vent hole closest to the outer periphery, the outer peripheral region situated on an outer side of the imaginary circle;
a plurality of pin-shaped convex portions protruding upward from the upper surface of the base body; and
a ring-shaped convex portion protruding upward from the upper surface of the base body and surrounding the plurality of pin-shaped convex portions,
wherein at least a part of the plurality of pin-shaped convex portions arranged in the outer peripheral region are first pin-shaped convex portions that each include a first convex element and a second convex element, the first convex element protruding upward from the upper surface of the base body, and the second convex element protruding upward from an upper end surface of the first convex element and having an upper end surface whose area is smaller than an area of the upper end surface of the first convex element, the plurality pin-shaped convex portions include second pin-shaped convex portions each having a columnar shape and an upper end surface, and
a maximum diameter of the upper end surface of each of the first convex elements is larger than a maximum diameter of the upper end surface of each of the second pin-shaped convex portions.

2. The substrate holding member according to claim 1, wherein:
the base body further includes an inner side with respect to the outer peripheral region;
the plurality of pin-shaped convex portions include second pin-shaped convex portions each having a columnar shape; and
at least a part of the plurality of pin-shaped convex portions disposed on the inner side of the base body are the second pin-shaped convex portions.

3. The substrate holding member according to claim 2, wherein:
the outer peripheral region further includes a circular-ring-shaped region and an outer side with respect to the circular-ring-shaped region; and
at least a part of the plurality of pin-shaped convex portions positioned on the outer side of the base body are the second pin-shaped convex portions.

4. The substrate holding member according to claim 1, wherein
the plurality of pin-shaped convex portions include second pin-shaped convex portions each having a columnar shape and an upper end surface, and
an area of an upper end surface of each of the first pin-shaped convex portions is equal to an area of the upper end surface of each of the second pin-shaped convex portions.

5. The substrate holding member according to claim 1, wherein a distance from the upper surface of the base body to an upper end surface of each of the plurality of pin-shaped convex portions is 120 μm to 180 μm, and wherein a distance from the upper surface of the base body to the upper end surface of each of the first convex elements is 0.4 times to 0.6 times the distance from the upper surface of the base body to the upper end surface of each of the plurality of pin-shaped convex portions.

6. The substrate holding member according to claim 1, wherein the base body has a grooved portion that communicates with the vent holes and that opens in a lower surface of the base body.

* * * * *